United States Patent
Taft et al.

(10) Patent No.: US 7,525,358 B1
(45) Date of Patent: Apr. 28, 2009

(54) DUTY-CYCLE CORRECTION FOR CLOCK RECEIVER

(75) Inventors: Robert Callaghan Taft, Munich (DE); Christopher Alan Menkus, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 10 days.

(21) Appl. No.: 11/156,043

(22) Filed: Jun. 17, 2005

(51) Int. Cl.
H03K 3/017 (2006.01)
H03K 5/04 (2006.01)
H03K 7/08 (2006.01)

(52) U.S. Cl. .................................. 327/175
(58) Field of Classification Search ............. 327/172, 327/175
See application file for complete search history.

(56) References Cited

U.S. PATENT DOCUMENTS

| | | | | |
|---|---|---|---|---|
| 6,424,178 | B1 * | 7/2002 | Harrison | 326/93 |
| 6,593,789 | B2 * | 7/2003 | Atallah et al. | 327/175 |
| 6,643,790 | B1 * | 11/2003 | Yu et al. | 713/500 |
| 6,859,095 | B2 * | 2/2005 | Nandy et al. | 330/9 |
| 6,963,235 | B2 * | 11/2005 | Lee | 327/158 |
| 7,088,160 | B2 * | 8/2006 | Harms et al. | 327/175 |
| 2004/0189364 | A1 * | 9/2004 | Lee et al. | 327/175 |
| 2005/0073344 | A1 * | 4/2005 | Furuya | 327/158 |
| 2005/0122149 | A1 * | 6/2005 | Cho et al. | 327/175 |
| 2005/0285649 | A1 * | 12/2005 | Chun et al. | 327/172 |

OTHER PUBLICATIONS

Rudy J. Van De Plassche et al., "A High-Speed 7 Bit A/D Converter," *IEEE*, Dec. 6, 1979 (6 pgs).
Kevin Kattmann et al., "A Technique for Reducing Differential Non-Linearity Errors in Flash A/D Converters," *IEEE*, Feb. 14, 1991 (2 pgs).
Klaas Bult et al., "An Embedded 240-mW 10-b 50-MS/s CMOS ADC in 1-mm$^2$," *IEEE*, Dec. 12, 1997 (9 pgs).
Opris et al., "A Single-Ended 12b 20MSample/s Self-Calibrating Pipeline A/D Converter," *ISSCC*, Feb. 6, 1998 (3 pgs).
D. Fu et al., "Digital Background Calibration of a 10b 40MSamples/s Parallel Pipelined ACD," *ISSCC*, Feb. 6, 1998 (3 pgs).
K. Dyer et al., "Analog Background Calibration of a 10b 40MSample/s Parallel Pipelined ADC," *IEEE*, Feb. 17, 1999 (3 pgs).

(Continued)

*Primary Examiner*—Quan Tra
(74) *Attorney, Agent, or Firm*—Merchant & Gould, P.C.

(57) ABSTRACT

A clock receiver for an integrated circuit includes duty-cycle correction capabilities based on monitoring an average value associated with an internally generated clock signal. An active adjustment circuit within the clock receiver provides correction to each leg of the differential clock signal based on two correction signals. The correction signals are derived from a comparison of the average value associated with the internal clock signal with a target voltage. The target voltage is based on a trip-point of an inverter stage in a logic stage that is driven by the internal clock signal. The closed loop control of the correction signals adjusts the average value of the internal clock signal until it is substantially equal to the target voltage. By straddling the internal clock signal about the trip-point of the inverter stage, the duty-cycle associated with the internal clock signal is adjusted to substantially a 50% duty cycle.

15 Claims, 7 Drawing Sheets

OTHER PUBLICATIONS

William Ellersick et al., "GAD: A 12-GS/s CMOS 4-bit A/D converter for an Equalized Mulit-Level Link," *Symposium on VLSI Circuits of Technical Papers*, 1999 (4 pgs).

Jun Ming et al., "An 8b 80MSample/s Pipelined ADC with Background Calibration," *IEEE*, Feb. 7, 2000 (3 pgs).

Kouji Sushihara et al., "WP 26.2 A 6b 800MSample/s CMOS A/D Converter," *IEEE*, Feb. 9, 2000 (2 pgs).

Krishnaswamy Nagaraj, et al., "A Dual-Mode 700-Msamples/s 6-bit 200-Msamples/s 7-bit A/D Converter in a 0.25-μm Digital CMOS Process," *IEEE* Dec. 12, 2000 (9 pgs).

Govert Geelen, "A 6b 1.1GSample/s CMOS A/D Converter," *IEEE*, Feb. 6, 2001 (3 pgs).

Robert C. Taft et al., "A 100-Ms/s 8-b CMOS Subranging ADC with Sustained Parametric Performance from 3.8 V Down to 2.2 V," *IEEE*, Mar. 2001 (8 pgs).

Naoki Kurosawa et al., "Explicit Analysis of Channel Mismatch Effects in Time-Interleaved ADC Systems," *IEEE*, Mar. 2001 (11 pgs).

Peter Scholtens et al., "A 6b 1.6Gsample/s Flash ADC in 0.18 μm CMOS using Averaging Termination," *ISCC*, Feb. 5, 2002 (3 pgs).

Ken Poulton et al., "A 4GSample/s 8b ADC in 0.35 μm CMOS," *ISSCC*, Feb. 5, 2002 (3 pgs).

Po-Hui Yang et al., "Low-Voltage Pulsewidth Control Loops for SOC Applications," *IEEE*, Oct. 2002 (4 pgs).

Shafiq M. Jamal et al., "A 10-b 120-Msample/s Time-Interleaved Analog-to-digital Converter with Digital Background Calibration," *IEEE*, Dec. 12, 2002 (10 pgs).

Ken Poulton et al., "A 20GS/s 8b ADC with a 1MB Memory in 0.18 μm CMOS," *IEEE*, 2003 (10 pgs).

Xicheng Jiang et al., "A 2GS/s 6b ADC in 0.18 μm CMOS," *IEEE*, Feb. 12, 2003 (10 pgs).

Robert Taft et al., A 1.8V 1.6GS/s 8b Self-Calibrating Folding ADC with 7.26 ENOB at Nyquist Frequency, *IEEE*, Feb. 17, 2004 (2 pgs).

Robert C. Taft et al., "A 1.8-V 1.6-GSample/s 8-b Self-Calibrating Folding ADC with 7.26 ENOB at Nyquist Frequency," *IEEE*, Dec. 12, 2004 (9 pgs).

Ozan E. Erdogan, et al., "A 12b Digital-Background-Calibrated Algorithmic ADC with-90dB THD," *IEEE*, Feb. 17, 1999 (3 pages).

Michael Choi, et al., "A 6b 1.3GSample/s A/D Converter in 0.35pm CMOS," *IEEE*, Feb. 6, 2001 (3 pages).

National Semiconductor Corporation, "A/D Converter," web article, *Signal News*, 2004 (2 pages).

National Semiconductor, "ADC08D1000 High Performance, Low Power, Dual 8-Bit, 1 GSPS A/D Converter," Sep. 2004 (31 pages).

\* cited by examiner

DUTY-CYCLE CORRECTION FOR CLOCK RECEIVER

FIELD OF THE INVENTION

The present disclosure generally relates to electronic circuits. More particularly, the present disclosure relates to a technique to provide duty-cycle correction to a clock signal generated within a circuit based on a received clock signal.

BACKGROUND

Electronic systems can often be implemented in a microelectronic circuit that is typically referred to as an IC or integrated circuit. These electronic systems typically include a number of passive and active electronic components, including but not limited to: transistors, resistors, capacitors, inductors, logic gates, linear amplifiers, voltage regulators, signal processors and converters, to name a few.

Many integrated circuits (ICs) generate an internal clock signal based on a received clock signal. A number of signal processing, data transfer, and other functions may be performed employing the internal clock signal. For example, analog signals can be converted into the digital domain, complicated signal processing functions can be performed, digital signals can be stored, high speed data transfer operations can be performed, and the like.

The reliable generation of internal clock signals is an important aspect of IC design, especially with increasing clock frequencies. Compensation of external and internal non-ideal characteristics of the received and generated clock signals may prevent operating inefficiencies and other complications in electronic systems.

BRIEF DESCRIPTION OF THE DRAWINGS

Non-limiting and non-exhaustive embodiments are described with reference to the following drawings.

DETAILED DESCRIPTION

Figure 1:
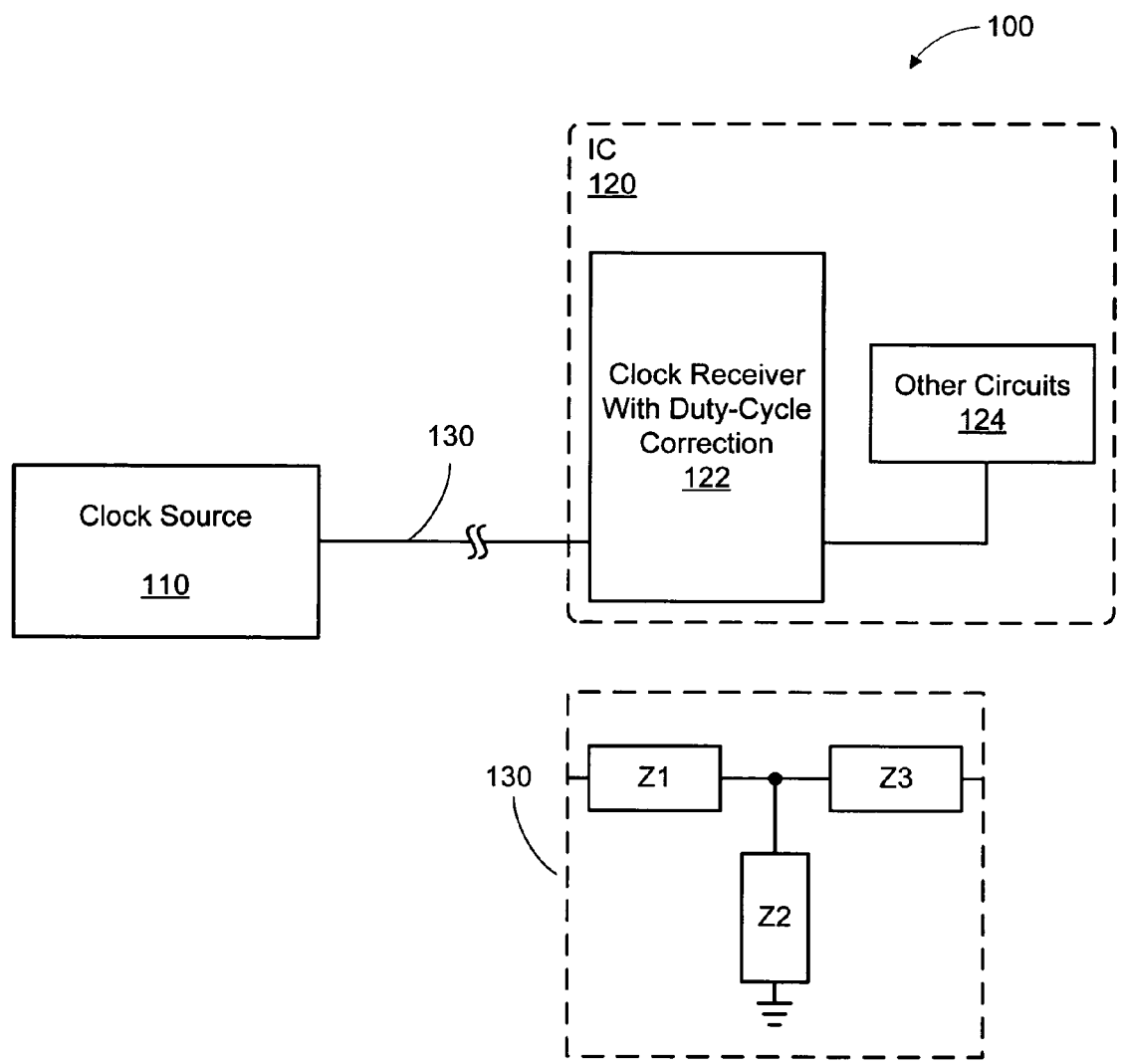
FIG. 1 is a block diagram of an example system, where a clock receiver with duty-cycle correction may be implemented.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electro-magnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity.

Briefly stated, the present disclosure generally relates to a clock receiver for an integrated circuit with duty-cycle correction capabilities. According to one embodiment, the distorted shape of a received clock signal is compensated in a clock receiver by: generating an internal clock signal, monitoring the internal clock signal, determining an average value associated with the clock signal, evaluating a trip-point associated with an inverter in the clock receiver, and adjusting the duty-cycle of the internal clock signal until the average value associated with the clock signal approximately matches the trip-point of the inverter.

General System Concept

FIG. 1 is a block diagram of example system 100, where a clock receiver with duty-cycle correction may be implemented. System 100 includes clock source 110 and IC 120, which are coupled through connection means 130. IC 120 includes clock receiver 122 and other circuits 124.

Clock source 110 may include any circuit that is arranged to provide a clock signal such as an oscillator, a receiver, and the like. IC 120 may include any micro-electronic circuit that may utilize a clock such as, for example, an analog-to-digital converter (ADC), a digital-to-analog conversion (DAC) circuit, a signal processing circuit, a digital signal processing circuit, a data transmission circuit, a bus driver circuit, a data storage circuit, and the like. Clock source 110 and IC 120 may be on the same circuit board, on different circuit boards, or even in different devices. For example, clock source 110 may include a transmitter in a wireless server and IC 120 a receiver in a client device with the two circuits communicating through wireless means.

As mentioned above, IC 120 may include a number of different circuits depending on its purpose. Clock receiver 122 is a circuit that is arranged to generate and/or process a received clock signal and provide an internal clock signal to other circuits 124 within the IC for their operation.

Non-ideal received clock signals can occur due to a number of factors. Such non-ideal effects can result in an unreliable internal clock signal such as, for example, an inconsistent duty-cycle, excessive ringing in the signals, as well as an occasional missed clock pulse. The physical connections between the clock source (110) and the clock receiver (122) in the integrated circuit (120) has a parasitic impedance that may create non-ideal errors between the signal from the clock source (110) and the signal received at the clock receiver (122). The parasitic impedances can be represented by a complex impedance that is illustrated by Z1, Z2 and Z3 (130) as shown in FIG. 1. The parasitic impedance (e.g., resistance, capacitance, and inductance) can be caused, for example, by the signal traces on the printed circuit board, the solder joints between the integrated circuit (120) and the printed circuit board, the lead-frame in the integrated circuit, the bonding-wire between the lead-frame in the integrated circuit package and the bond-pad on the integrated circuit die, the signal return path between the ground in the clock receiver circuit and the ground of the printed circuit board, to name a few.

In one example, single-ended external clock signals from the clock source (110) may result in internal clock signals that have a relatively poor duty-cycle due to a common-mode mismatch between the external clock signal and the clock receiver circuit. Such a mismatch may occur even when the external clock signal has a perfect 50% duty-cycle. The common-mode mismatch can be caused in part by semiconductor processing variations in the integrated circuit (120), as well as from other sources such as parasitic impedances, ground differences between the internal ground of the clock receiver and the ground for the integrated circuit, thermally generated difference in the integrated circuit, and dynamic differences between the board ground reference and the integrated circuit ground reference due to either resistive drops or noise (commonly referred to as ground-bounce).

A differential clock receiver circuit typically is more immune to ground-bounce and common-mode shifts when compared to single-ended clock receiver circuits. Thus, differential clock receiver circuits typically produce better internal clock signals at the expense of a more complex clock receiver circuit. Additional circuitry for converting a differential signal to a single-ended logic level is usually included in such differential clock receiver circuits.

It is increasingly more difficult to achieve an internal clock signal with a 50% duty-cycle when the received clock signal increases in operating frequency, even for differential clock receivers. One approach to improve the duty-cycle of the internally generated clock signal includes AC coupling between the external clock signal and the clock receiver circuit. An advantage of AC coupling approach is that self-biasing on-chip resistors may result in the chip setting its own required common-mode point to the differential clock receiver, independent of the common-mode of the external clock. Another advantage of the AC coupling approach is that due to the integrating effect of an RC input network large signal offsets and poor duty-cycles in the external clock may be improved.

Phase-Locked-Loop (PLL) circuits are sometimes used in a clock receiver circuit, where an internal clock signal is generated that has an operating frequency that is a multiple of the received external clock signal. Delay circuits such as that proposed in U.S. Pat. No. 6,407,596 can also be used to generate an internal clock signal. Such receiver clock solutions, and other similar solutions for correcting for the received clock signal's duty-cycle generally add to power consumption and increased circuit complexity. In many cases, the duty-cycle variations in the received clock signal have to be within particular limits for the solution to effectively compensate.

According to one embodiment, a clock receiver for an integrated circuit includes duty-cycle correction capabilities based on monitoring an average value associated with an internally generated clock signal. An active adjustment circuit within the clock receiver provides correction to each leg of the differential clock signal based on two correction signals. The correction signals are derived from a comparison of the average value associated with the internal clock signal with a target voltage. The target voltage is based on a trip-point of an inverter stage in a logic stage that is driven by the internal clock signal. The closed loop control of the correction signals adjusts the average value of the internal clock signal until it is substantially equal to the target voltage (e.g., the trip point of the following inverter stage). By straddling the internal clock signal about the trip-point of the inverter stage, the duty-cycle associated with the internal clock signal is adjusted to substantially a 50% duty cycle.

Example Operation

For a perfect clock (i.e., a ground referenced, rail-to rail single ended clock with a 50% duty cycle and equal rise and fall times), the ideal average value of the clock signal is $V_{supp}/2$. Accordingly, for high duty-cycles the clock signal has a high value that is longer in time than that for the low value such that the resulting average value is higher than $V_{supp}/2$. Similarly, for low duty-cycle clock signals, the clock signal has a low value that is longer in time than that for the high value such that the average value is lower than $V_{supp}/2$.

The monitored average value may correspond to the received clock directly at the input, the clock at the output of a differential-to-single-ended converter, or the signal after one or more stages of logic circuits (or perhaps logic buffers), which is generally closer to a rail-to-rail logic signal. The average of the clock signal may also be obtained by low-pass filtering of the monitored clock signal.

Figure 2:
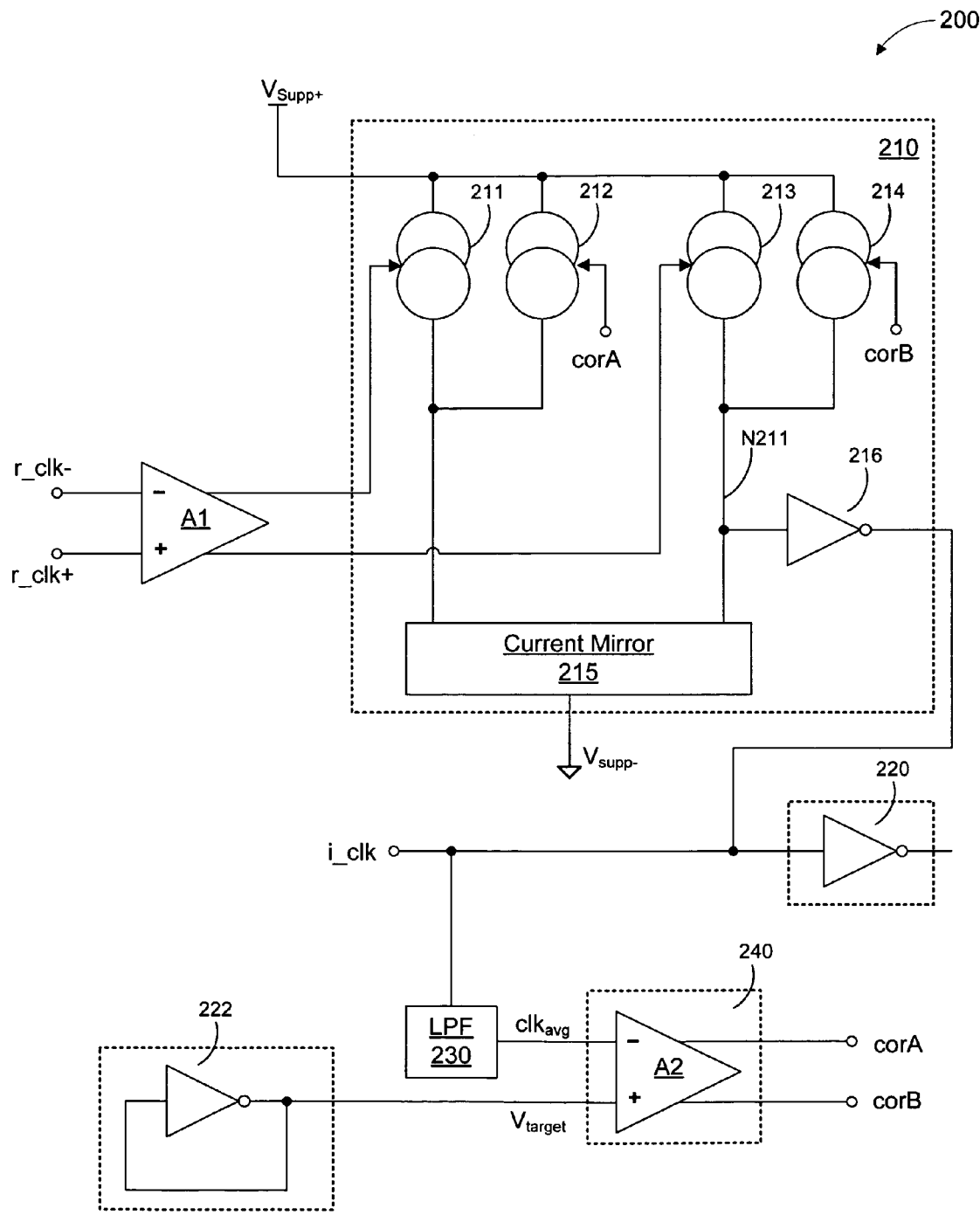
FIG. 2 is a schematic block diagram of an example clock receiver with duty-cycle correction for single-ended internal clock signal.

FIG. 2 is a schematic block diagram of example clock receiver 200 with duty-cycle correction for a single-ended internal clock signal. Clock receiver 200 includes input differential amplifier A1, active adjust circuit 210, buffer circuit 220, low-pass filter 230, and adjust control circuit 240.

Input differential amplifier A1 is arranged to cooperate with active adjust circuit 210 to amplify received differential clock signal (r_clk+ and r_clk−) and provide a single-ended signal at node N211. Active adjust circuit 210 includes current source circuits 211-214, current mirror circuit 215, and optional buffer circuit 216. Current source circuits 211 and 213 are controlled in response to the output of differential amplifier A1, which is responsive to the received clock signal. Current source circuits 212 and 214 are arranged to cooperate with current source circuits 211 and 213, respectively. Current mirror 215 is coupled to current sources 211-214 and configured to convert the received differential clock signal to a single-ended clock signal at node N211.

Current sources 212 and 214 are controlled by correction signals corA and corB, respectively. Current sources 211, 213 and current mirror 215 are arranged to adjust the clock signal in a push-pull manner that is observed at node N211. Optional buffer-circuit 216 receives the signal from node N211 and provides an internal clock signal (i_clk). Buffer circuit 220 is arranged to receive internal clock signal i_clk, and in a typical application will provide the internal clock signal to other circuits in the integrated circuit. Low-pass filter circuit 230 receives internal clock signal i_clk and provides an average value (e.g., $clk_{avg}$). Buffer circuit 222 is arranged in a self-bias configuration to generate a target voltage ($V_{target}$), which is substantially the same as a trip-point voltage that is associated with buffer circuit 220. Adjust control circuit 240 is arranged to compare the average value of the clock signal ($clk_{avg}$) to the target voltage ($V_{target}$) such as with amplifier circuit A2. Signals corA and corB are adjusted by adjust control circuit 240 in response to the comparison between $clk_{avg}$ and $V_{target}$. When the average value of the clock signal ($clk_{avg}$) reaches a substantially 50% duty-cycle, clock signal i_clk straddles target voltage $V_{target}$ of buffer circuit 220. Differential amplifier A2 thus operates in a closed negative feedback loop with feedback provide by signals corA and corB.

Active adjust circuit 210 is configured to operate between high and low supply voltages $V_{supp+}$ and $V_{supp-}$. As discussed previously, the ideal average voltage of the internal clock signal (i_clk) is $V_{supp}/2=(V_{supp+}-V_{supp-})/2$. However, buffer circuit 220 may have a trip-point that is different from $V_{supp}/2$. In this case, buffer circuit 220 may not toggle in response to the internal clock signal (i_clk) since the internal clock signal has a trip-point that is different from $V_{supp}/2$. Signals corA and corB provide feedback to active adjust circuit 210. Active adjust circuit 210 is configured to change the average voltage ($clk_{avg}$) of the internal clock signal so that the internal clock signal (i_clk) has an average value that matches the trip-point for buffer circuit 220. In a buffer circuit comprising inverter (s) (e.g., buffer circuit 220 is an inverting circuit), the target voltage ($V_{target}$) is obtained from a crow-barred (or self-biased) replica inverter circuit (222).

In one example embodiment, the crow-barred inverter (222) may be complemented with current limiting resistors. In another example, the crow-barred inverter (222) may be modified to shut down during a power-down mode. Modifications to crow-barred inverter 222 may be made so long as the operation of the crow-barred inverter has substantially the same trip-point as buffer circuit 220.

Buffer circuit 220 may include one or more buffering stages as may be desired to provide additional stages of signal gain. Buffer circuit 220 may further be implemented to provide a logic gate function such as a NAND function, a NOR function, or some other function that may be desired to permit a shut down mode, an initialization, as well as others.

In one embodiment, the internal clock signal is monitored at the output of buffer circuit 216. In other embodiments, average voltage $clk_{avg}$ is derived from monitoring node N211 or at the output of differential amplifier A1. A low-pass filter circuit such as LPF 230 may be employed to provide average voltage $clk_{avg}$. Low-pass filter circuit 230 may be implemented by an active filter, or a passive filter such as an RC-type filter.

The non-ideal duty-cycle of the internal clock signal (i_clk) is corrected in two ways. First, the average value of the clock signal i_clk is adjusted to substantially equal the trip-point ($V_{target}$) of buffer circuit 220. Second, the rise and fall times associated with the signal at node N211 are adjusted so that the falling to rising edge separation either increases or decreases, again adjusting the duty-cycle of the clock signal at N211 and thereby the signal i_clk. Current source circuits 212 and 214 are employed to adjust both mechanisms in response to signals corA and corB. For the example implementation where buffer circuit 216 is eliminated, internal clock signal i_clk is observed directly from node N211 such that the voltage of node N211 has an average value that is substantially equal to $V_{target}$.

A variety of factors can influence the timing and accuracy associated with the internal clock signal including but not limited to: the duty-cycle of the received clock signal, non-ideal offset voltages from various circuits, asymmetries in the clock receiver circuit, mismatches in buffering, offset voltages and/or noise coupling into the routing of signals to name a few. Accurate clock spacing is generated by the selective control of the average value of the clock signal via the active adjust circuit and the adjustment control circuit. Since the circuits have an adaptive control topology, one where the adjustment is a continuously running dynamic adjustment, a degree of error in the received clock signal duty-cycle does not impair the overall performance of the system. In other words, the imperfections in the system (e.g., semiconductor process based variations, mismatch errors, offset errors, temperature based errors, etc.) are handled within the control loop for the clock signals such that excellent performance is achieved despite such imperfections.

Figure 3:
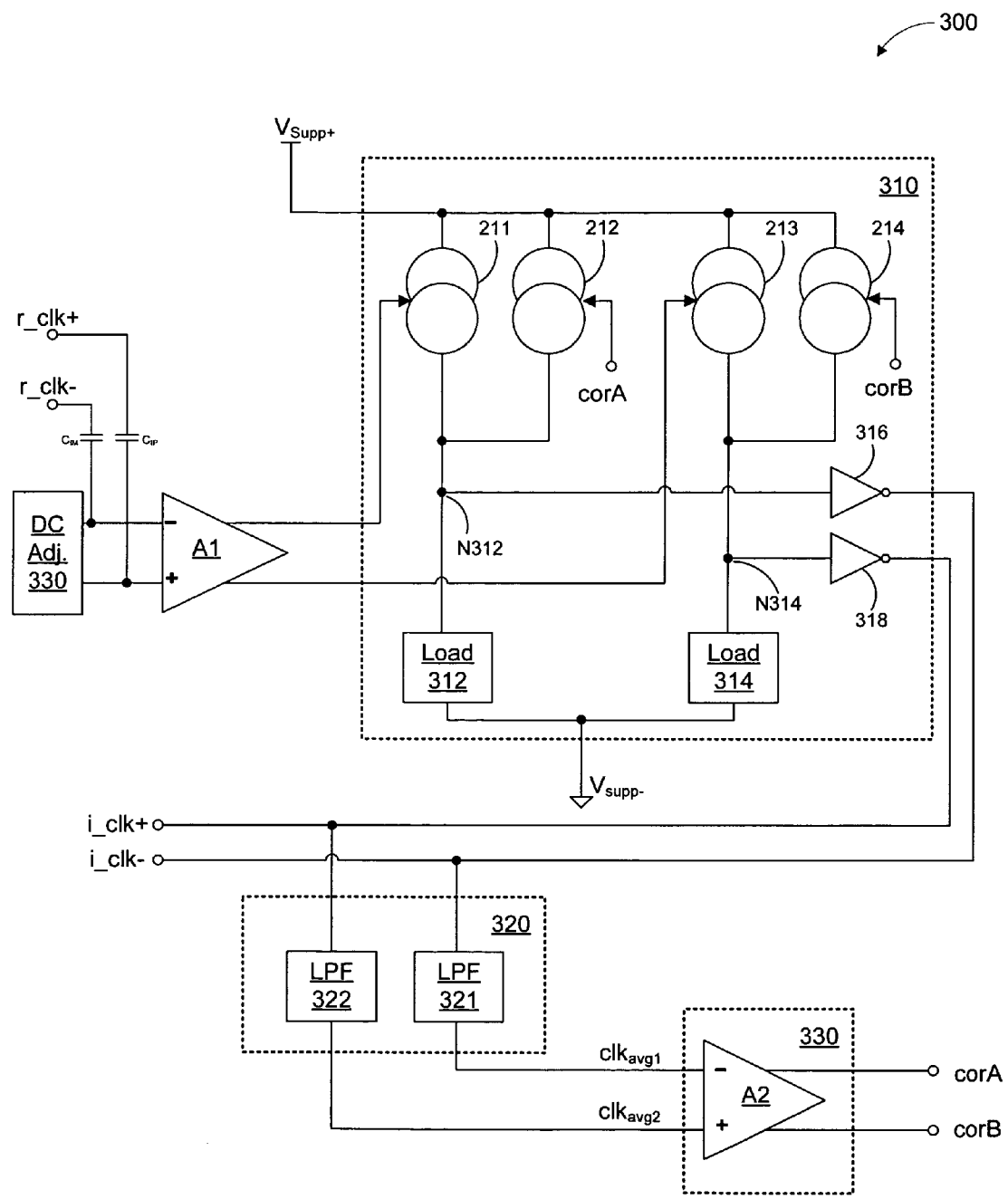
FIG. 3 a schematic block diagram of another example clock receiver with duty-cycle correction for differential internal clock signal.

FIG. 3 is a schematic block diagram of a clock receiver circuit (300) with duty-cycle correction for differential internal clock signal according to another embodiment. Components of clock receiver 300 that are similar to those described with respect to clock receiver 200 of FIG. 2 are similarly labeled and arranged to operate in a likewise manner.

Active adjust circuit 310 differs from active adjust circuit 210 of FIG. 2 in that current mirror circuit 215 is replaced by loads 312 and 314. The load circuits (312 and 314) are configured to cooperate with current source circuits 211-214 to generate a differential clock signal that is observed at nodes N312 and N314. Two optional buffer circuits (316, 318) are included in active adjust circuit 210 to provide a buffered differential clock signal (i_clk+, i_clk−) from nodes N312 and N314. Adjustment of the internal differential clock signal (i_clk+, i_clk−) is achieved in a similar manner as that described previously with respect to the single ended clock signal (i_clk) of FIG. 2.

The differential clock signal (i_clk+, i_clk−) is coupled to a differential filter circuit 320. The differential filter circuit is illustrated as two separate low pass filter circuits (321, 322), but may be implemented as a single circuit block. The output of the differential filter circuit (320) corresponds to a differential average signal ($clkavg1$, $clk_{avg2}$) that is coupled to an input of an adjust control circuit (330). Adjust control circuit 330 is arranged to provide feedback to active adjust circuit 310 as signals corA and corB, similar to that described with respect to FIG. 2. The internal differential clock signal (i_clk+, i_clk−) is provided to the other circuits (e.g., 124 in FIG. 1). Since FIG. 3 is a fully differential implementation, no target voltage generator is required. The average value associated with the internal differential clock signal is substantially zero. However, for the differential clock signal (i_clk+, i_clk−), the individual average values of i_clk+ and i_clk− are substantially equal to one another when the duty cycle correction methods described above are properly applied.

In one example implementation, the received clock (r_clk+, r_clk−) is AC coupled to the clock receiver 300 through AC coupling capacitors $C_{IM}$ and $C_{IP}$. Since the received clock is AC coupled, a DC adjustment circuit (330) is employed to adjust the DC levels for operation within an acceptable range for amplifier A1. The AC coupling arrangement minimizes potential common-mode problems and large DC signal offsets associated with the received clock signal.

Example Systems

Figure 4:
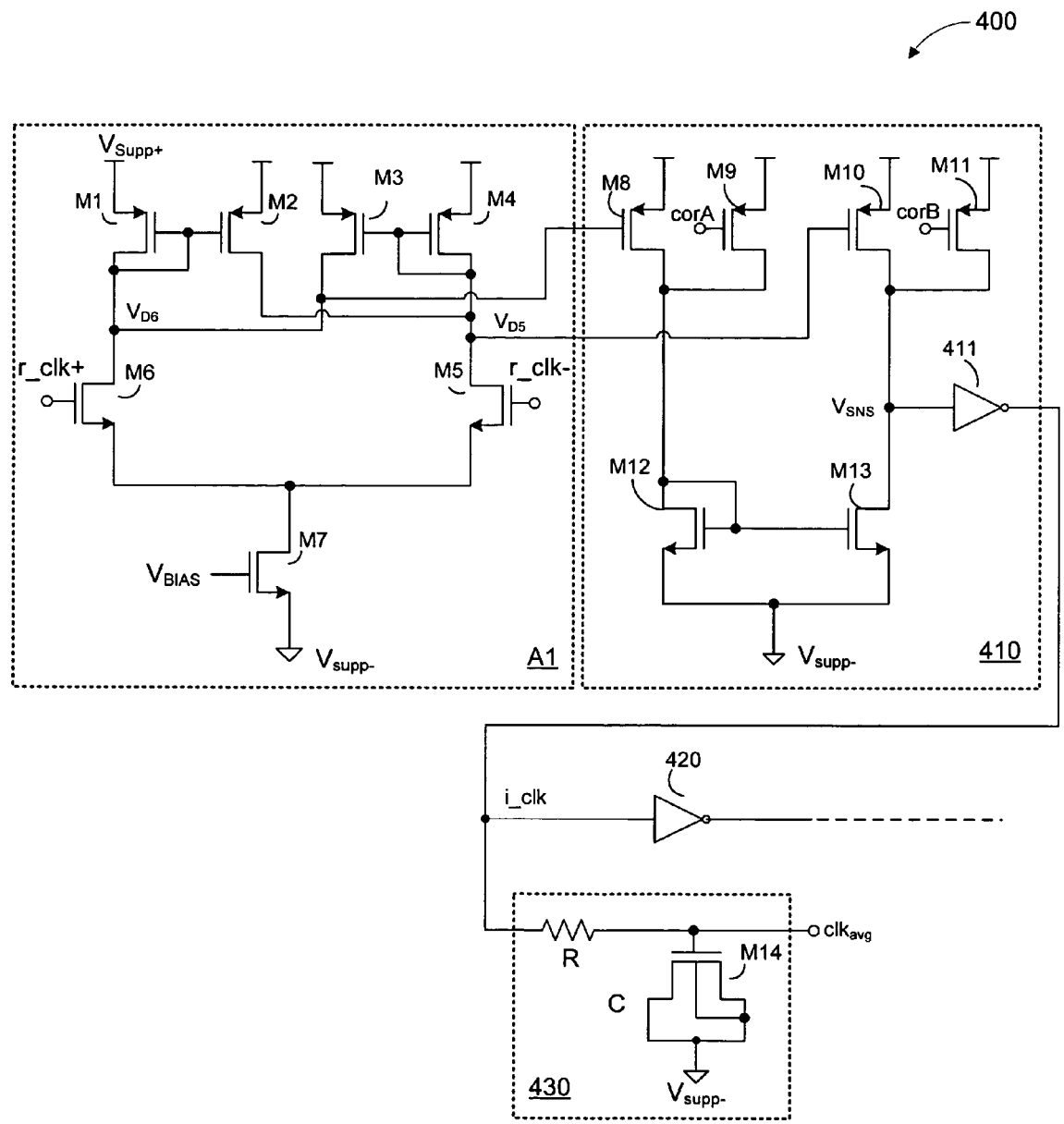
FIG. 4 is a partial schematic diagram of an example implementation of the clock receiver of FIG. 2.

FIG. 4 is a partial schematic diagram of clock receiver 400, which is an example implementation of the clock receiver illustrated in FIG. 2. The partial schematic diagram includes differential amplifier A1, active adjust circuit 410, inverting buffer circuit 420, and low-pass filter circuit 430.

Differential amplifier A1 includes transistors M1-M7. Transistors M1 and M2 are arranged in a common gate configuration, while transistors M3 and M4 are similarly arranged in another common gate configuration. Transistors M5 and M6 are arranged to operate as a differential front end, with common source terminals coupled to the drain of transistor M7. Transistor M7 is configured to operate as a current source that is biased by a biasing signal ($V_{BIAS}$). Transistors M5 and M6 are arranged to receive signals r_clk− and r_clk+, respectively. Transistor M1 is configured to operate as a diode load that is coupled to the drain of transistor M6, while transistor M4 is similarly configured to operate as a diode that is coupled to the drain of transistor M5. Transistor pairs M1, M2 and M3, M4 are configured to operate as a load-stabilization circuit for differential amplifier A1. Tail transistor M7 is arranged to draw current from the differential amplifiers and to provide on/off control of the circuit. The difference between the signals r_clk+ and r_clk− is amplified and observable as the drain voltages (VD5, VD6) for transistors M5 and M6. Drain voltages VD5 and VD6 are provided to active adjust circuit 410 as control voltages.

Active adjust circuit 410 includes transistors M8-M13, and optionally includes buffer circuit 411. Transistor M8 is configured to operate as a current source that is responsive to voltage VD6. Transistor M9 is configured to operate as a current source that is responsive to signal corA. Transistor M10 is configured to operate as a current source that is response to voltage VD5. Transistor M11 is configured to operate as a current source that is responsive to signal corB. Transistors M12 and M13 are configured to operate as a current mirror circuit. The drain currents from transistors M8 and M9 are collected by transistor M12 on one side of the current mirror circuit, while the drain currents from transistors M10 and M11 are collected by transistor M13 on the other side of the current mirror circuit.

A single-ended signal ($V_{SNS}$) is provided at the drains of transistors M10, M11 and M13, which is coupled to an input of optional inverting buffer circuit 411. Inverting buffer circuit 411 senses changes in the single-ended signal ($V_{SNS}$) and provides internal clock signal i_clk. Internal clock signal i_clk is provided from inverting buffer circuit 411 to low-pass filter circuit 430, which is operated as a monitoring circuit that monitors an average value associated with the internal clock signal (i_clk). Low-pass filter circuit 430 includes resistor circuit R and transistor M14, which is configured to operate as a capacitor (C). The low-pass filter circuit provides an average voltage ($clk_{avg}$) associated with the internal clock signal i_clk. The internal clock signal (i_clk) is coupled to buffer circuit 420, similar to that described previously.

As described previously with respect to FIG. 2, the average ($clk_{avg}$) associated with the internal clock signal (i_clk) is used in determining correction signals corA and corB. Signals corA and corB are arranged to control the magnitude of current that is provided by transistors M9 and M11, respectively. In one example, the magnitude of the current provided by transistor M11 is increased in response to a decrease in signal corB such that the voltage ($V_{SNS}$) associated with the drain of transistor M13 increases. In another example, the magnitude of the current provided by transistor M9 is increased in response to a decrease in signal corA such that the current mirror circuit is forced to draw more current into the drain of transistor M13, resulting in a decrease in the voltage ($V_{SNS}$) associated with the drain of transistor M13. The output signal that is observed at the drain of transistor M13 is thus adjusted in a push-pull manner that is responsive to correction signals corA and corB. Under closed loop control, such as that described with respect to FIG. 2, the average value of the internal clock signal ($clk_{avg}$) is substantially equal to the trip-point associated with buffer circuit 420.

Clock receiver 400 is one implementation of a clock receiver circuit that is arranged according to an example embodiment of the present invention. Other implementations with fewer or additional components may be realized without departing from a scope and spirit of the invention. Moreover, the functions of the circuits described herein may be combined or separated as may be desired. Additionally, the functions of various circuits such as the differential pair, the current sources, the controlled current sources, the various current mirror circuits, the inverting buffer circuit, and the low-pass filter circuit may be provided by different circuit arrangements without departing from the spirit of the invention.

Active adjust circuit 410 illustrates that two currents are provided in response to the received clock signal to generate the internal clock signal. The internal clock signal may be observed as signal $V_{SNS}$, or it may be observed after optional buffer 411. The left hand side of the current-mirror forms a first circuit branch with a first operating current, while the right hand side of the current-mirror forms a second circuit branch that operates with a second operating current. The branch operating currents can be modified using the feedback arrangements described above with respect to FIG. 4. In one example, only one feedback signal is provided to active adjust circuit 410 (e.g., only corA, or only corB). For this example, one of the transistors can be removed (e.g., M11) and the duty cycle adjustment is accomplished by only one feedback signal (e.g., corA) in substantially the same way as previously described. In another example, transistor M9 can be changed to an n-type transistor that is coupled in parallel with transistor M13 instead of in parallel with transistor M8. For this example, transistor M9 draws current such that the signal $V_{SNS}$ decreases for increasing values of corA, resulting in a change in the duty cycle of the internal clock signal. In still another example, transistor M11 is changed to an n-type transistor that is coupled in parallel with transistor M12 instead of in parallel with transistor M10. For this example, transistor M11 draws current away from transistor M12 such that signal $V_{SNS}$ increases for increasing values of corB, again resulting in a change in the duty-cycle of the internal clock signal. Other examples are contemplated such that the branch currents into the mirror circuit (or the load circuits for the example of FIG. 3) are modified to change to overall duty-cycle.

Amplifier A1 includes a differential pair that is formed by transistors M5 and M6. One side of the differential pair (e.g., one circuit branch) is typically operated with a current (e.g., $I_D$ for transistor M5) that is substantially matched to another current (e.g., $I_D$ for transistor M5) on the other side of the differential pair (e.g., another circuit branch). In accordance with the spirit of the present invention, the branch currents for the differential pair can be modified to provide adjustment to the duty cycle. In one example, a current source circuit is arranged to couple additional current to the drain of transistor M5 in response to a feedback signal. In another embodiment, a current source circuit is arranged to couple additional current to the drain of transistor M6 in response to a feedback signal. Additional examples are also contemplated such that the branch currents in the differential pair are modified to adjust the duty-cycle that is observed with the internal clock signal.

Figure 5:
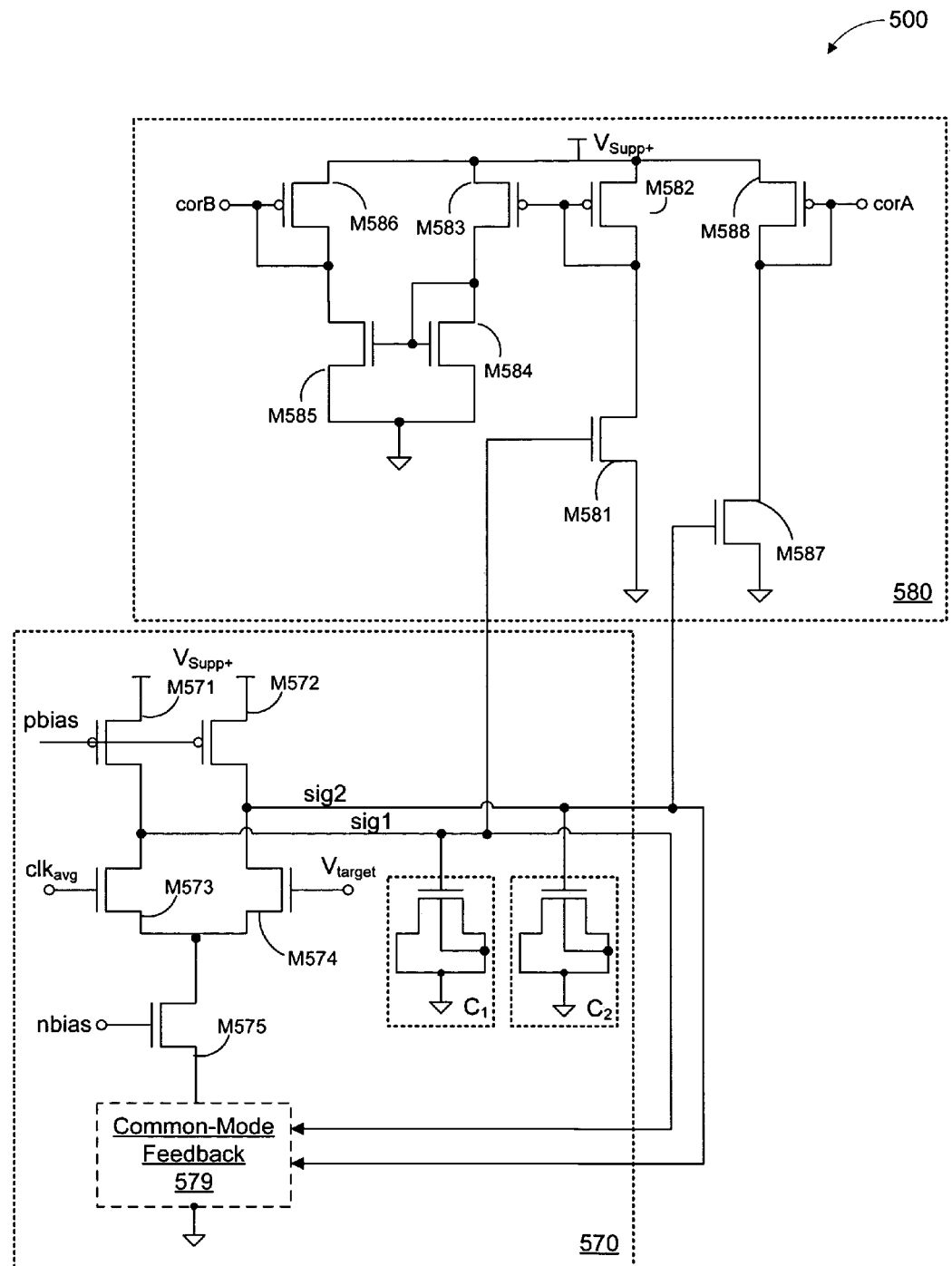
FIG. 5 is a schematic diagram of an example implementation of the adjustment control circuit of FIG. 2.

FIG. 5 is a schematic diagram of adjustment control circuit 500, which is an example implementation of the adjustment control circuit of FIG. 2. The adjustment control circuit (500) includes an integrator circuit (570) and a dynamic bias adjustment circuit (580). Integrator circuit 570 includes transistors M571-M575, two capacitor circuits (C1, C2), and a common-mode-feedback circuit (579). Dynamic bias adjustment circuit 580 includes transistors M581-M588.

Transistors M573 and M574 are arranged in a common-source configuration to operate as a differential pair that is responsive to signals $clk_{avg}$ and $V_{target}$. Transistors M571 and M572 are arranged to operate as current sources that are biased by signal pbias. Transistor M575 is arranged to operate as a current source that is responsive to signal nbias, and coupled to the common source terminal of the differential pair circuit. Common-mode feedback circuit 579 is coupled to the common-source terminal of the differential pair through the current source circuit (e.g., transistor M575). Integrator circuit 570 includes two signal lines (sig1, sig2), where each of the signal lines is coupled to a respective one of the capacitor circuits ($C_1$, $C_2$).

The charging and discharging of capacitor circuits $C_1$ and $C_2$ is determined by the difference between signals $clk_{avg}$ and $V_{target}$. In one example, capacitor circuit $C_1$ is charged by the current source represented by transistor M571 when the signal $V_{target}$ is greater than $clk_{avg}$. In another example, capacitor circuit $C_1$ is discharged by the current source represented by transistor M575 when the signal $V_{target}$ is less than $clk_{avg}$. In still another example, capacitor circuit $C_2$ is charged by the current source represented by transistor M572 when the signal $V_{target}$ is less than $clk_{avg}$. In yet another example, capacitor circuit $C_2$ is discharged by the current source represented by transistor M575 when the signal $V_{target}$ is greater than $clk_{avg}$. The integrator circuit (570) is arranged such that one or more error voltages are developed by the interaction with the capacitor circuits and the various current sources in response to the difference between signals $clk_{avg}$ and $V_{target}$. The common-mode feedback circuit (579) senses the levels associated with the capacitor voltages and adjusts the overall tail current that is used by the input differential pair.

The dynamic bias circuit (580) includes a first current mirror circuit comprising transistors M582, M583, and a second current mirror circuit comprising transistors M585, M584. The drain of transistor M581 is coupled to the gate and drain of transistor M582, while the gate of transistor M581 is coupled to signal sig1. The gate of transistor M583 is coupled to the gate and drain of transistor M583, while the drain of transistor M583 is coupled to the gate and drain of transistor M584. The gate of transistor M585 is coupled to the gate and drain of transistor M584, while the drain of transistor M585 is coupled to the gate and drain of transistor M586. The gate and drain of transistor M586 are configured to provide signal corB. The drain of transistor M587 is coupled to the gate and drain of transistor M588, while the gate of transistor M587 is coupled to signal sig2. The gate and drain of transistor M588 are configured to provide signal corA.

Transistors M581 and M587 are responsive to signals sig1 and sig2, respectively, to adjust signals corA and corB. In one example, an increase in signal sig1 will result in increased drain current for transistor M581, which through the current mirrors causes a decrease in signal corB. In another example, an increase in signal sig2 will result in increased drain current for transistor M587, which causes a decrease in signal corA.

In one implementation the current mirror arrangements of transistors M583-M586 are eliminated and signal corB corresponds to the drain voltage of transistor M581. In another example, the ratio of the current mirrors provided by transistors M582/M583 and M585/M584 are adjusted to provide gain scaling (either increasing signal gain, or decreasing signal gain) to adjusting the overall the sensitivity of signal corB relative to changes in signal sig1. In still another example, the current mirrors provided by transistors M582/M583 and M585/M584 are arranged to provide improved matching to counter-balance non-ideal mismatch problems that are observed in another current mirror circuit such as transistors M12 and M13 from FIG. 4. Additional current mirror arrangements can be employed to adjust the sensitivity for signal corA, as will be understood in view of the above description.

Figure 6:
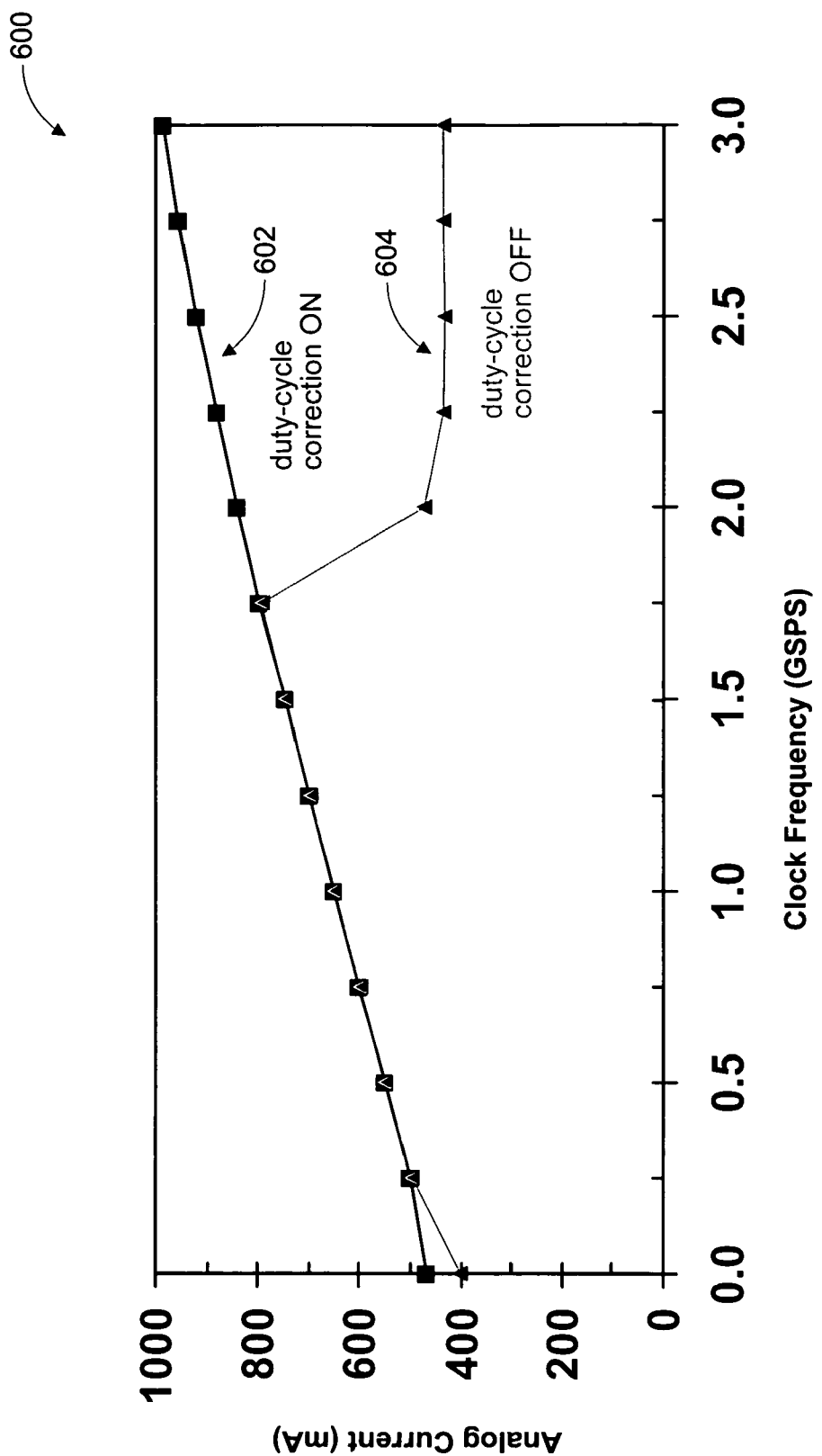
FIG. 6 is a diagram illustrating an effect of duty-cycle correction in an Analog-to-Digital Converter (ADC) by comparing analog current versus clock frequency of the clock receiver of the ADC.

FIG. 6 includes diagram 600 illustrating an effect of duty-cycle correction in an example Analog-to-Digital Converter (ADC) by comparing analog current versus clock frequency of an input converter of the ADC.

As the diagram shows, analog current of the input converter increases in linear proportion to the clock frequency up to about 2 GHz regardless of whether duty-cycle correction is implemented or not. Around 2 GHz, however, the current begins to drop drastically indicating a drop in the ADC's performance when no duty-cycle correction is implemented (plot 604).

When duty-cycle correction is implemented, the analog current continues to rise linearly up to 3 GHz indicating continued performance of the ADC with the increased clock frequency.

Figure 7A:
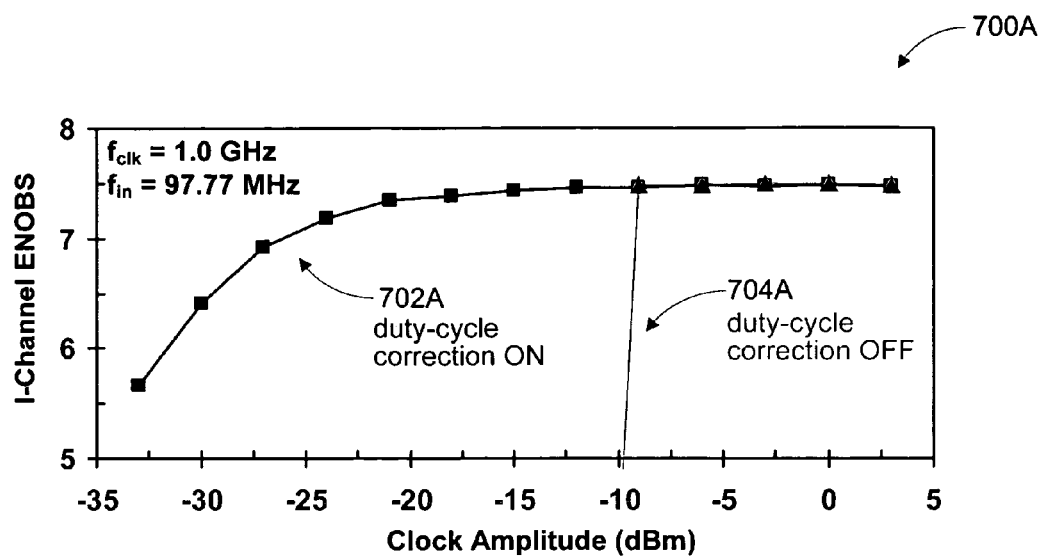
FIGS. 7A and 7B are diagrams illustrating effects of duty-cycle correction in an ADC.
Figure 7B:
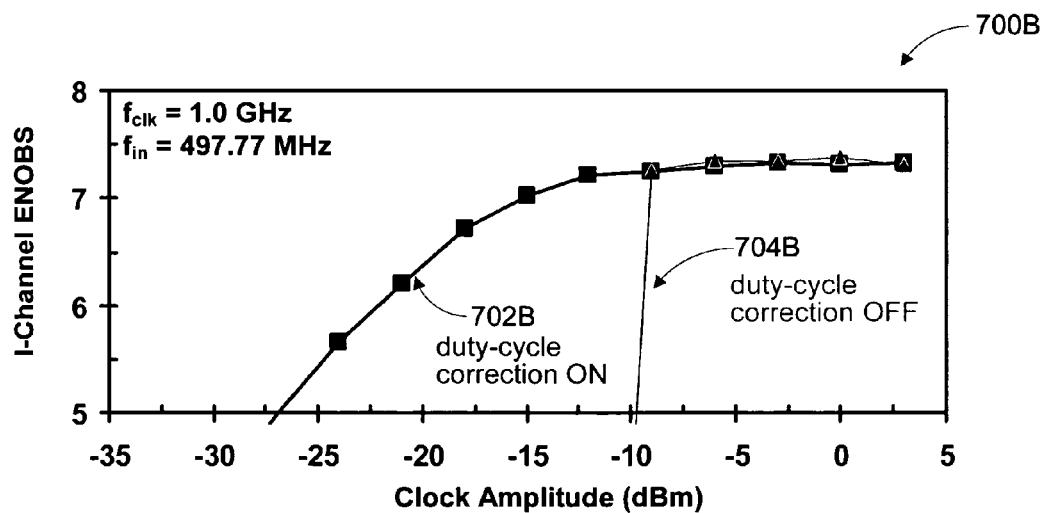

FIGS. 7A and 7B include diagrams 700A and 700B illustrating effects of duty-cycle correction in an ADC circuit.

As mentioned previously, embodiments of the clock receiver described herein may be employed by a variety of integrated circuits. An ADC is one example circuit that relies heavily on received clock signal quality. A figure of merit for the performance of the ADC corresponds to the Effective Number of Bits associated with the input channel (referred to as: I-Channel ENOBs in FIGS. 7A and 7B).

Diagram 700A of FIG. 7A shows I-Channel ENOBs versus clock amplitude for an example ADC working at a clock frequency of 1 GHz and input frequency of 97.77 MHz. As illustrated by plot 704A, performance of the ADC drops drastically for clock amplitudes −10 dBm and lower when duty-cycle correction is turned off.

On the other hand, the ADC continues to perform, although with some degradation in the number of effective bits of resolution, for clock amplitudes of down to −35 dBm when duty-cycle correction is turned on (e.g., see plot 702A). Accordingly, a duty-cycle correction technique such as those described herein may provide about 25 dB additional clock amplitude range for the ADC.

Diagram 700B shows the performance of the same ADC at a higher input frequency with clock frequency remaining at 1 GHz. For an input frequency of 497.77 MHz, the ADC operation drops to unacceptable levels again around a clock amplitude value of about −10 dBm (e.g., see plot 704B). With duty-cycle correction turned on the ADC functions for another 15 dB of clock amplitude range (e.g., see plot 702A). At higher input frequencies, timing jitter from noise coupling onto the input clock cannot be reduced by duty-cycle correction. Therefore the signal amplitude range is not as good as for example $f_{in}$=97.77 MHz, but the duty-cycle correction still provides 15 dB of additional clock amplitude range for the ADC to function.

Although the invention has been described herein by way of exemplary embodiments, variations in the structures and methods described herein may be made without departing from the spirit and scope of the invention. For example, the positioning of the various components may be varied. Individual components and arrangements of components may be substituted as known to the art. Since many embodiments of the invention can be made without departing from the spirit and scope of the invention, the invention is not limited except as by the appended claims.

What is claimed is:

1. An apparatus for adjusting a single-ended internal clock signal in an integrated circuit (IC) that receives a fully-differential external clock signal, the apparatus comprising a clock receiver circuit that is arranged to generate the single-ended internal clock signal in response to the fully-differential external clock signal, the clock receiver circuit comprising:
   a differential amplifier circuit that is arranged to provide a fully differential output that is continuously responsive to the fully-differential external clock signal, wherein the fully differential output corresponds to a first control voltage and a second control voltage;

a first current source circuit that is responsive to the first control voltage, wherein the first current source is referenced to a power supply terminal;

a second current source circuit that is responsive to the second control voltage, wherein the second current source circuit is referenced to the power supply terminal;

a current mirror circuit that includes a first terminal that is coupled to the first current source and a second terminal that is coupled to the second current source, wherein the first current source circuit is arranged to couple a first current to the first terminal and the second current source circuit is arranged to couple a second current to the second terminal, wherein the internal clock signal is sensed from either the first terminal or the second terminal of the current mirror circuit; and a means for continuously adjusting either the first current or the second current in response to a first and second differential output such that an average value associated with the single-ended internal clock signal is substantially equal to a trip-point that is associated with a single-ended logic circuit that receives the single-ended internal clock signal; wherein the means for continuality adjusting includes a differential comparator that generates the first and second differential output in response to a comparison between the sensed internal clock signal and a target signal that is a substantially constant voltage associated with the trip-point.

2. The apparatus of claim 1, the clock receiver circuit comprising: a means for evaluating an average value associated with the single-ended internal clock signal.

3. An apparatus for adjusting a single-ended internal clock signal in an integrated circuit (IC) that receives a fully-differential external clock signal, the apparatus comprising:

a clock receiver circuit that is arranged to generate the single-ended internal clock signal in response to the fully-differential external clock signal, wherein the clock receiver circuit includes a first circuit branch that is configured to operate with a first current, and a second circuit branch that is configured to operate with a second current, wherein the clock receiver circuit is arranged such that the first current and the second current cooperate with one another to provide the single-ended internal clock signal, the clock receiver circuit comprising:

a differential amplifier circuit that is arranged to provide a first control voltage and a second control voltage in response to the fully-differential external clock signal;

a first current source circuit that is arranged to provide a first portion of the first current in response to the first control voltage; and a second current source circuit that is arranged to provide a first portion of the second current in response to the second control voltage;

a third current source circuit that is arranged to provide a second portion of the first current in response to a third control voltage such that the third current source modifies the first current; and a fourth current source circuit that is arranged to provide a second portion of the second current in response to a fourth control voltage such that the fourth current source modifies the second current, wherein the third and fourth control voltages are associated with the at least one control signal from a control circuit;

a monitoring circuit that is arranged to monitor an output of the clock receiver circuit to provide a sense signal; and a control circuit that is arranged to provide at least one control signal to the clock receiver circuit in response to an evaluation of the sense signal, wherein the clock receiver circuit is further arranged to adjust a magnitude associated with at least one of the first current and the second current in response to the at least one control signal by varying either the third control voltage or the fourth control voltage such that a duty cycle associated with the single-ended internal clock signal is changed; wherein the control circuit is arranged to adjust the third voltage and the fourth voltage, respectively, in direct response to a first differential output a comparison between the sense signal and a target signal that is a substantially constant voltage associated with a trip-point associated with a logic circuit associated with clock output logic.

4. The apparatus of claim 3, further comprising: a first buffer circuit that is arranged to provide a buffered internal clock signal in response to the internal clock signal, the first buffer circuit comprising at least one of: a single-ended non-inverting buffer, a single-ended inverting buffer, a differential non-inverting buffer, a differential inverting buffer, a single ended amplifier, a differential amplifier, a logic gate, an inverter gate, a NAND gate, a NOR gate, a plurality of logic gates, or a plurality of inverter gates.

5. The apparatus of claim 3, further comprising:

a first buffer circuit that is arranged to receive the internal clock signal; and a second buffer circuit that is arranged to generate a target signal that is substantially the same as a trip-point that is associated with the first buffer circuit; wherein the control circuit is arranged to adjust the at least one control signal in response to a comparison between the sense signal and the target signal.

6. An apparatus for adjusting a single-ended internal clock signal in an integrated circuit (IC) that receives a fully-differential external clock signal, the apparatus comprising:

a clock receiver circuit that is arranged to generate the single-ended internal clock signal at an output of the clock receiver circuit in response to the fully-differential external clock signal, wherein the clock receiver circuit is arranged such that a first current and a second current cooperate with one another to provide the single-ended internal clock signal, the clock receiver circuit comprising:

a differential pair circuit that is arranged to sense the fully-differential external clock signal;

a first load circuit that is coupled to one side of the differential pair circuit and configured to operate with the first current in a first circuit branch;

a second load circuit that is coupled to another side of the differential pair circuit and configured to operate with the second current in a second circuit branch;

a first transistor circuit that is coupled to the first load circuit, wherein the first transistor circuit is arranged to modify the first current in response to a first of the at least one control signal; and a second transistor circuit that is coupled to the second load circuit, wherein the second transistor circuit is arranged to modify the second current in response to a second of the at least one control signal;

a monitoring circuit that is arranged to monitor the single-ended internal clock signal at the output of the clock receiver circuit to provide a sense signal; and a control circuit that is arranged to provide at least one control signal to the clock receiver circuit in response to an evaluation of the sense signal, wherein the clock receiver circuit is further arranged to adjust a magnitude of the first current and the second current in response to a first and second differential output from a comparison between the sense signal and a target signal that is a substantially constant voltage associated with a trip-point of a logic circuit such that a duty cycle associated with the single-ended internal clock signal is changed.

7. The apparatus of claim 3, the monitoring circuit comprising: a low-pass filter circuit that is configured to provide the sense signal as an average value that is associated with the single-ended internal clock signal.

8. The apparatus of claim 3, the control circuit comprising an integrator circuit and a dynamic bias circuit, wherein the integrator circuit is arranged to evaluate the sense signal, and wherein the dynamic bias circuit is arranged to provide the at least one control signal in response to at least one output of the integrator circuit.

9. The apparatus of claim 3, wherein the single-ended internal clock signal corresponds to at least one of: a single-ended clock signal, and a differential clock signal.

10. A method of adjusting a duty-cycle of a single-ended internal clock signal in an integrated circuit (IC) that receives a fully-differential external clock signal, the method comprising:
    evaluating the fully-differential external clock signal with a clock receiver circuit, wherein the clock receiver circuit is arranged to provide the single-ended internal clock signal by:
        generating a differential control voltage in response to the fully-differential external clock signal with a differential amplifier;
        generating a first current that is referenced to a power supply terminal in response to a first portion of the differential control voltage;
        coupling the first current to a first load at a first node;
        generating a second current that is referenced to the power supply terminal in response to a second portion of the differential control voltage;
        coupling the second current to a second load at a second node;
        generating a third current in response to a control signal;
        coupling the third current to one of the first node and the second node; and
        evaluating a voltage associated with one of the first node and the second node with a logic circuit such that the single-ended internal clock signal is produced;
    determining an average value associated with the single-ended internal clock signal;
    generating a substantially constant target voltage with a self-biased logic circuit, wherein the self-biased logic circuit has a trip-point that is matched to the logic circuit;
    differentially comparing the average value associated with the single-ended internal clock signal to the target voltage to generate a first and second differential output that are coupled to the third current; and
    adjusting the single-ended internal clock signal by varying the control signal in response to the average value until the average value is matched to the trip-point indicating a substantially 50% duty cycle for the single-ended internal clock signal.

11. The method of claim 10, further comprising: coupling the single-ended internal clock signal to a low-pass filter circuit, wherein the low-pass filter circuit is arranged to provide the average value.

12. An apparatus for adjusting a duty-cycle of a single-ended internal clock signal for an integrated circuit that receives a fully-differential external clock signal, the apparatus comprising:
    a means for evaluating the fully-differential external clock signal with a clock receiver circuit, wherein the clock receiver circuit is arranged to provide the single-ended internal clock signal by:
        generating a differential control voltage in response to the fully-differential external clock signal;
        generating a first current that is referenced to a power supply terminal in response to a first portion of the differential control voltage;
        coupling the first current to a first load at a first node;
        generating a second current that is referenced to the power supply terminal in response to a second portion of the differential control voltage;
        coupling the second current to a second load at a second node;
        generating a third current in response to a control signal;
        coupling the third current to one of the first node and the second node; and
        evaluating a voltage associated with one of the first node and the second node with a logic circuit such that the single-ended internal clock signal is produced;
    a means for evaluating an average value related to the duty-cycle of the single-ended internal clock signal;
    a means for generating a substantially constant target voltage with a self-biased logic circuit, wherein the self-biased logic circuit has a trip-point that is matched to the logic circuit;
    means for differentially comparing the target voltage associated with the trip-point with the evaluated average value to generate a first and second differential output that are coupled to the third current such that the single-ended internal clock signal is adjusted in response to the evaluation of duty-cycle until the average value is matched to the target voltage, which indicates a substantially 50% duty cycle for the single-ended internal clock signal.

13. A method as in claim 10, further comprising generating the voltage for the first node and the second node with a current mirror circuit, wherein the first load corresponds to a first portion of the current mirror circuit, and wherein the second load corresponds to a second portion of the current mirror circuit.

14. The method of claim 10, further comprising evaluating the voltage associated with the other of the first node and the second node with a second logic circuit, wherein the single-ended internal clock signal corresponds to a differential clock signal that is provided by the logic circuit and the second logic circuit.

15. The method of claim 10, further comprising generating a fourth current in response to the control signal, and coupling the fourth current to the other of first node and the second node, wherein the control signal is a differential control consisting of a first portion and a second portion, wherein the first portion is associated with the control signal for the third current source and wherein the second portion is associated with the control signal for the fourth current source.

* * * * *